(12) United States Patent
Wojnarowski et al.

(10) Patent No.: US 6,635,987 B1
(45) Date of Patent: Oct. 21, 2003

(54) HIGH POWER WHITE LED LAMP STRUCTURE USING UNIQUE PHOSPHOR APPLICATION FOR LED LIGHTING PRODUCTS

(75) Inventors: Robert J. Wojnarowski, Ballston Lake, NY (US); Thomas J. Pozda, Hudson, OH (US)

(73) Assignee: General Electric Company, Schenectady, NY (US)

( * ) Notice: Subject to any disclaimer, the term of this patent is extended or adjusted under 35 U.S.C. 154(b) by 245 days.

(21) Appl. No.: 09/670,240

(22) Filed: Sep. 26, 2000

(51) Int. Cl.[7] .................................................. H01J 1/62
(52) U.S. Cl. ........................ 313/498; 313/512; 362/84
(58) Field of Search ............................... 313/512, 485, 313/635, 113, 506; 362/84, 800, 255

(56) References Cited

U.S. PATENT DOCUMENTS

| 3,834,883 | A | * | 9/1974 | Klein .......................... 257/100 |
|---|---|---|---|---|
| 5,225,023 | A | | 7/1993 | Wojnarowski et al. |
| 5,847,507 | A | * | 12/1998 | Butterworth et al. ........ 313/483 |
| 5,865,529 | A | * | 2/1999 | Yan .............................. 313/500 |
| 5,998,925 | A | * | 12/1999 | Shimizu et al. .............. 313/503 |
| 6,084,250 | A | * | 7/2000 | Justel et al. ................. 257/100 |
| 6,132,072 | A | * | 10/2000 | Turnbull et al. ............. 362/230 |
| 6,165,631 | A | * | 12/2000 | Boerner et al. ............. 257/100 |
| 6,281,526 | B1 | * | 8/2001 | Nitta et al. .................. 257/103 |
| 6,294,800 | B1 | * | 9/2001 | Duggal et al. .............. 257/100 |
| 6,340,824 | B1 | * | 1/2002 | Komoto et al. ................ 257/99 |
| 6,351,069 | B1 | * | 2/2002 | Lowery et al. .............. 313/501 |
| 6,361,192 | B1 | * | 3/2002 | Fussell et al. .............. 362/331 |
| 6,452,217 | B1 | * | 9/2002 | Wojnarowski et al. ........ 257/99 |
| 6,501,100 | B1 | * | 12/2002 | Srivastava et al. ............ 257/79 |
| 2002/0084745 | A1 | * | 7/2002 | Wang et al. ................. 313/498 |

* cited by examiner

Primary Examiner—Ashok Patel
Assistant Examiner—Glenn Zimmerman

(57) ABSTRACT

Phosphor application for high power LED lamps for use in lighting products includes a lensing structure and a phosphor layer applied to at least one side of the lensing structure. The lensing structure is positioned in the LED lamp so that emitted light from the LED die excites the phosphor layer. The lensing structure ensures both uniform color and light output as it eliminates the necessity of applying the phosphor layer directly to the LED die surface.

22 Claims, 8 Drawing Sheets

HIGH POWER WHITE LED LAMP STRUCTURE USING UNIQUE PHOSPHOR APPLICATION FOR LED LIGHTING PRODUCTS

BACKGROUND OF THE INVENTION

1. Field of the Invention

This invention pertains to phosphor application for high power LED devices used in lighting products. More particularly, the invention relates to a lighting product incorporating an LED lamp and a phosphor layer pre-applied to a plastic or glass cap or housing integral to the LED lamp structure.

2. Discussion of the Art

Current state of the art light emitting diode (LED) technology is less than 10 percent efficient in the visible spectra. The LED lamps of the GaN (gallium nitride) technology create white light by the conversion of blue or UV spectral emissions using phosphors and dyes to convert light into the white spectra.

The light output for a single LED is below that of known incandescent lamps, which are approximately 30 percent efficient in the visible spectra. Flashlights, using incandescent bulbs, have approximately 20 lumens of light output. An LED device having a comparable light output power density necessitates a larger LED design or a design comprising a multiple LED configuration. The structure must then be electrically pumped or driven at two to four times in rated current, to create an equivalent light output, as compared to conventional filament bulb technologies.

Presently available GaN technology disposes phosphor on the individual GaN die and converts the blue or UV light to a white light at the die surface. This die configuration is problematic in that it is difficult to mass produce. Moreover, the resultant LED lamps generally have varying color and light output attributes. In this regard, an identical phosphor material typically yields radically different color and/or light output depending on the thickness of the phosphor at the edges and top of the GaN die, which varies according to application techniques.

Thus, there is a particular need for both an improved LED lamp structure having a GaN LED die and process for application of a phosphor to the GaN LED die that results in both uniform color and light output.

BRIEF SUMMARY OF THE INVENTION

A new and improved high power lamp structure including a white LED device having an integrated pre-phosphorized bulb or lens structure is provided. Briefly, in accordance with one embodiment of the present invention, a high power LED lamp structure is provided which comprises at least one LED die and at least one lensing structure, at least one side of the at least one lensing structure having a phosphor layer applied thereto. The lensing structure is positioned in the LED lamp structure so that emitted light from the LED die excites the phosphor layer applied to the lensing structure.

A principal advantage of the present invention is that an integrated pre-phosphorized bulb or lens structure is disclosed, which replaces the application of phosphor layer to a GaN die surface.

A second advantage of the present invention is that an LED appliance is disclosed that yields equivalent energy on a surface when compared to a conventional filament incandescent bulb (including halogen technologies).

A third advantage of the present invention is that the phosphor layer, which is temperature sensitive and has an efficiency that degrades with temperature, is positioned in the lamp structure in a more controlled and lower temperature area of the lamp structure.

Still another advantage of the present invention is that a novel LED lamp structure is disclosed which can be mass produced.

Still a further advantage of the present invention is that an LED lamp structure is disclosed having longer lamp life, long battery life, and increased resistance to breakage of the bulb when the flashlight is dropped.

Still another advantage of the present invention is that a low cost assembly lighting product is disclosed for high volume appliance construction, particularly for flashlights of the hand-held variety.

Still another advantage of the present invention is an LED equivalent to a conventional incandescent bulb, is disclosed for use in connection with the upgrade or retrofit of flashlight devices or the like as a structural enhancement.

Still a further advantage of the present invention is that an enhanced bulb and lensing structure yielding good light flux area as compared to a conventional incandescent bulb flashlight is disclosed for use in the mass production of a flashlight design.

DETAILED DESCRIPTION OF THE INVENTION

Figure 3:
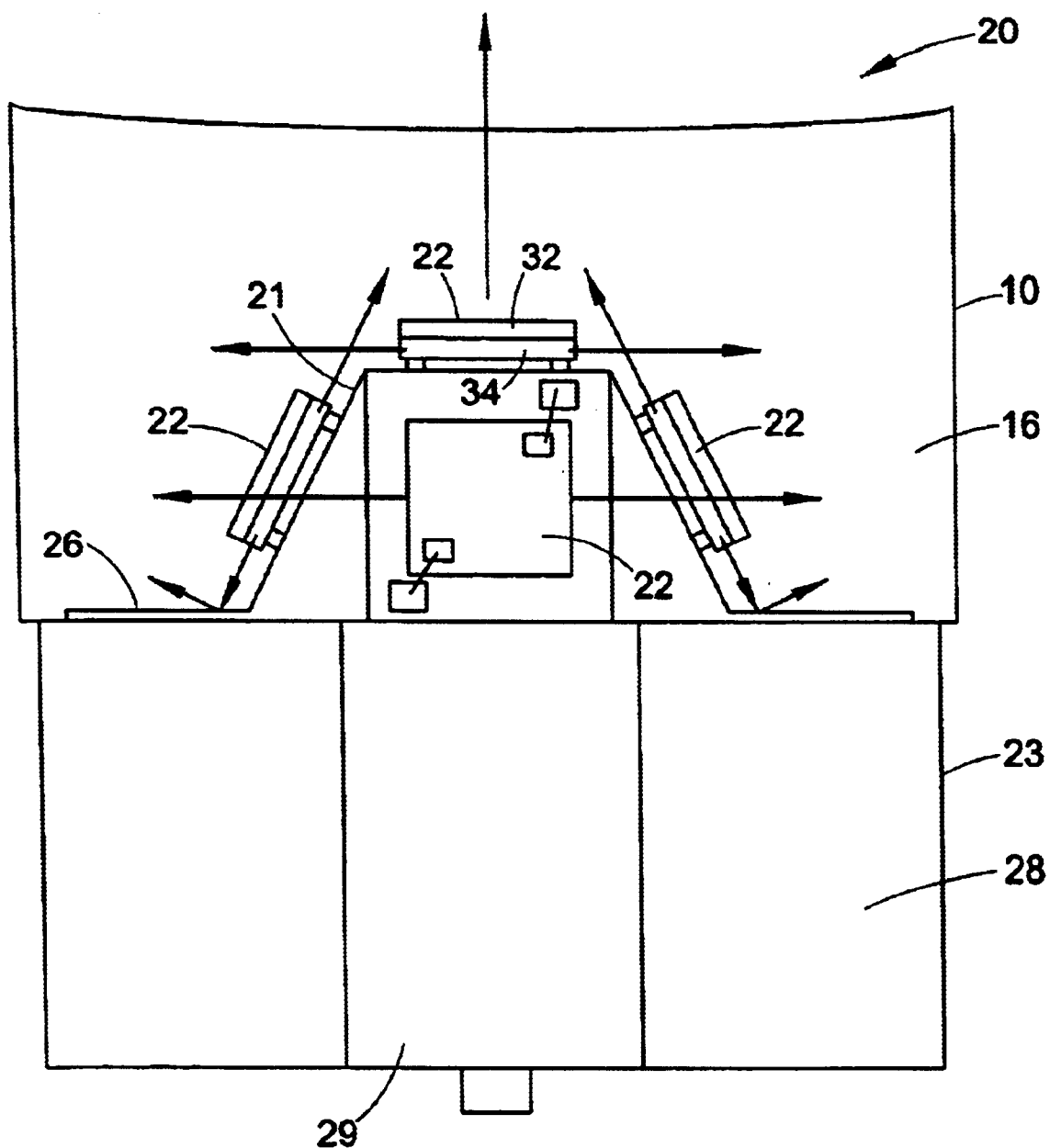
FIG. 3 is the multi-angled LED array of FIG. 1, including the application of a phosphor layer to a lensing structure.
Figure 7:
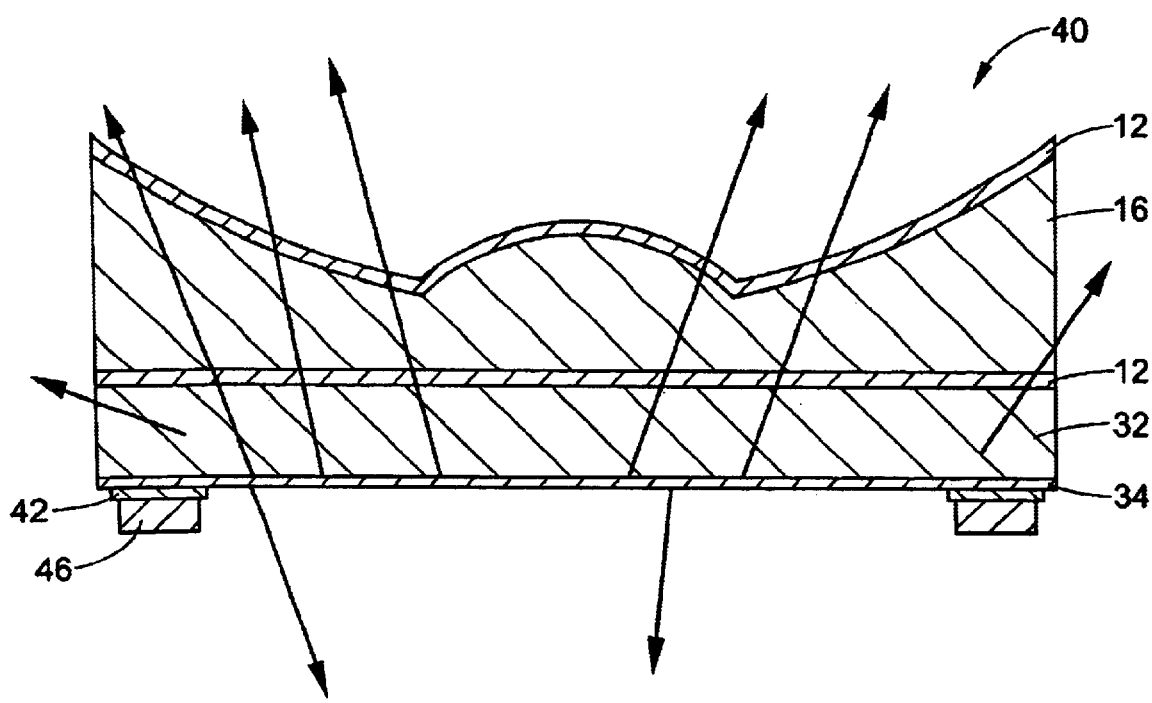
FIG. 7 is a cross-sectional view diagram of a flip chip μBGA structure illustrating a configuration of a lensing structure of the present invention.
Figure 8:
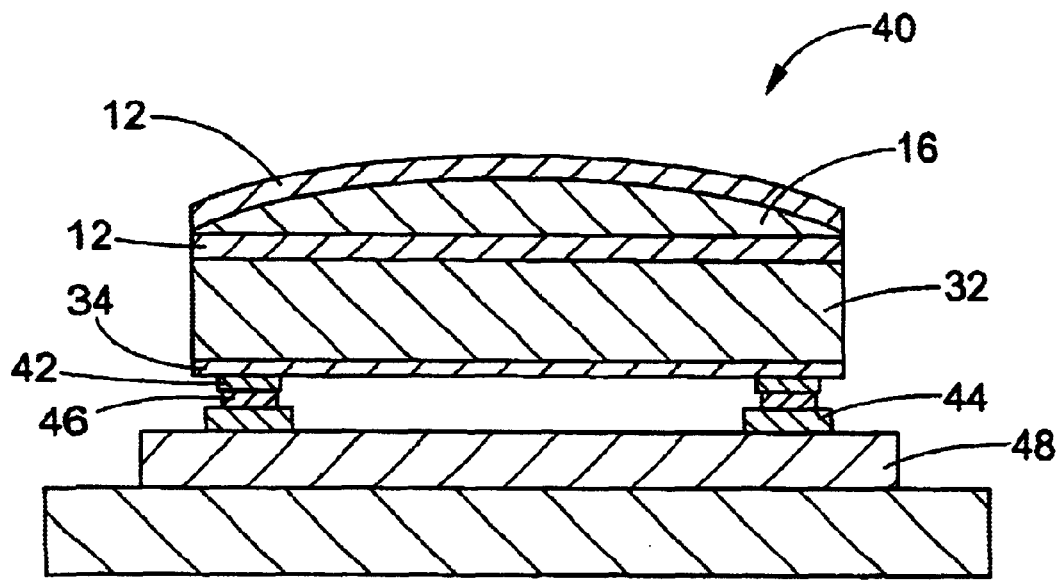
FIGS. 8–9 are cross-sectional view diagrams of a flip chip LED structure of the present invention having integral lensing structures and mounted in a flat LED assembly.
Figure 9:
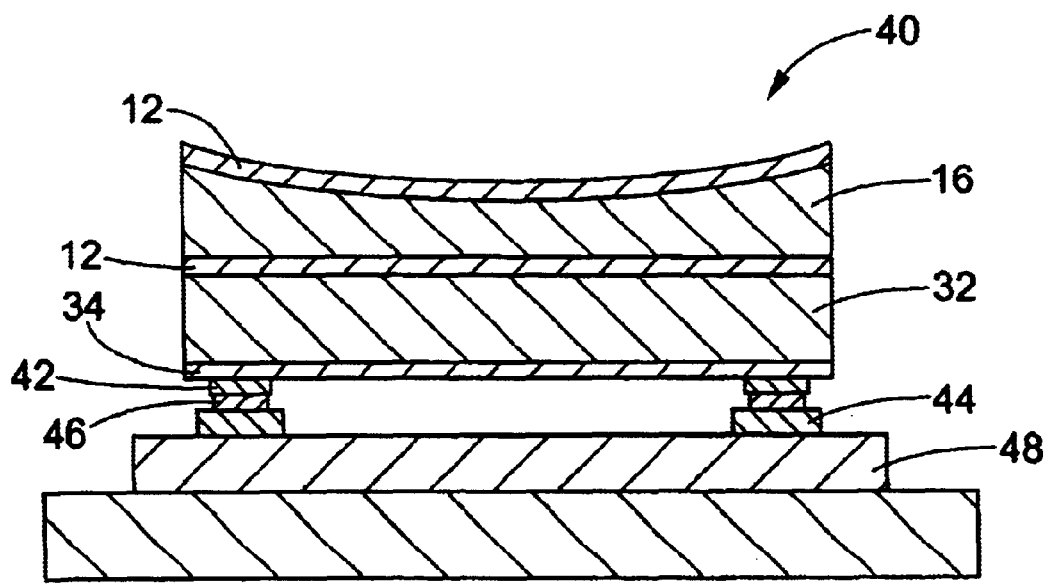

Referring now to the drawings, which illustrate a preferred embodiment of the invention only and are not intended to limit same, FIGS. 3, 5, and 7–9 illustrate a lensing structure 10 of the present invention used in connection with various LED lamp structures, including a multi-LED lamp structure 20 as best illustrated in FIG. 3 and an LED formed in a flip chip arrangement as illustrated in FIGS. 7–9. Although the lensing structure 10 of the present invention is illustrated in connection with these LED structures, one skilled in the art would recognize that the lensing structure 10 of the present invention is applicable to other LED structures, including a wire bonded LED structure. Moreover, the present invention is applicable to any light-emitting semiconductor devices other than LEDs, including laser diodes, and wide band gap LEDs.

Figure 1:
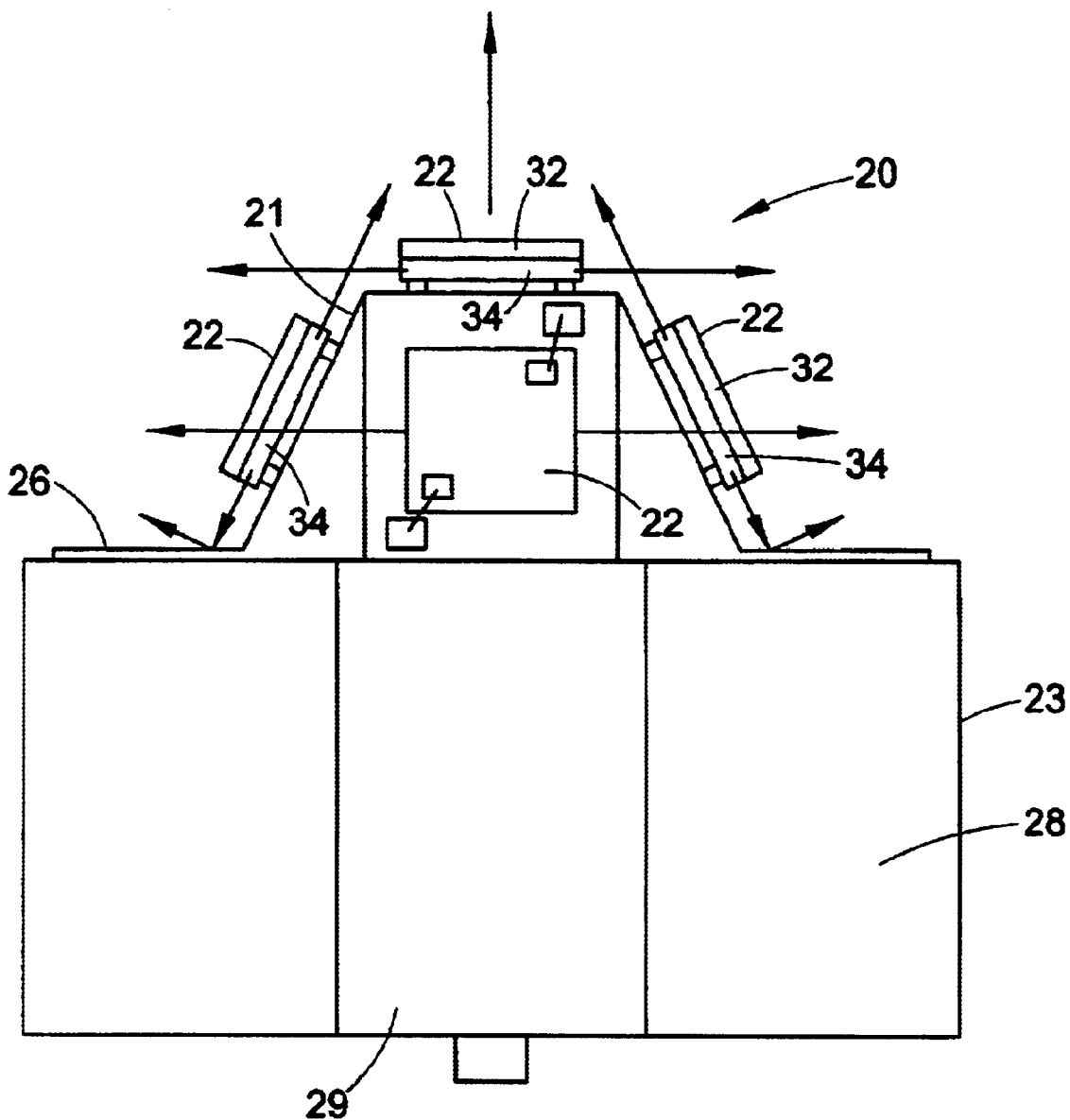
FIG. 1 is a side partial view of a multi-angled LED array for use in a newly-designed retrofit structure for a commercial flashlight.

FIG. 1 is a multi-LED lamp 20 showing multiple single die 22 as the desired light source. This multi-LED lamp 20 is disclosed in detail in co-pending application Ser. No. 09/607,700 to Wojnarowski, et al., entitled "High Power LED Lamp Structure Using Phase Change Cooling Enhancements for LED Lighting Products," and filed Jun. 30, 2000. The LED die structure 22 of FIG. 1 includes a semiconductor layer, preferably a GaN deposition layer 34 of the type well-known in the art. The LED die 22 further includes a substrate 32 which may comprise a substantially transparent material such as sapphire (aluminum oxide), for example. "Substantially transparent" is intended to mean sufficiently transparent to transmit a useful amount of light therethrough. Exemplary materials, which are useful for this purpose, include sapphire or spinel. "Spinel" refers to a group of minerals having the general formula $AB_2O_4$ wherein A is magnesium, ferrous ion, zinc, manganese or a combination thereof, and B is aluminum, ferric ion, chromium, or a combination thereof In the preferred embodiment, the substrate is comprised of sapphire, a single crystal aluminum oxide ($Al_2O_3$) generally used for semiconductor processing.

The thickness of the substrate 32 is not critical and will depend upon the particular application. The thickness typically ranges from about 80 to about 500 microns but may be ground thinner depending upon the application.

The multi-LED lamp 20 enables the use of more than one LED to approximate a high power LED structure. FIG. 1 illustrates a 5-LED geometric design that optimizes power output of the lamp 20 and increases light output by managing the light ray paths from the top and side edges of the GaN LED die 22. In the embodiment of FIG. 1, five LED die 22 are illustrated. However, the actual number of LEDs used in the design may be less than 5 or greater than 5 depending upon the vendor retrofit technology being used. For example, some flashlights have a 20 lumens output. Others, having krypton or other halogen bulbs, have a much greater light output. The exact number of LED die 22 used in the multi-LED lamp 20 varies depending upon the product. Approximately 50% of the light emitted from the LED die 22 is side-emitted light and, therefore, must be collected efficiently to produce desired results.

The lamp 20 is comprised of a multi-sided, multidimensional array 21, which emits light at angled ray trace paths. In the preferred embodiment, the array 21 is a four-sided, three-dimensional trapezoidal head 21, of a trapezoidal shape, where the LEDs are arranged so that the light escapes to the reflector, without colliding with other die or structures. The light is collected on a reflector 26 that produces a uniform high light intensity and density, comparable to a conventional incandescent bulb. In the preferred embodiment, the die 22 are arranged on the head 21 so that the side-emitted light is not blocked from the gathering process to the reflector 26—that is, the light cannot be emitted to another non-reflecting area and consequently be lost from the gathering process. In this regard, pedistles (not shown), recessions (not shown), or any other geometric positioning may be implemented in the design to allow for emission of light to a reflector 26 while simultaneously preventing blocking of the light by associated LED die 22. Although a three-dimensional trapezoidal head 21 is shown here, those skilled in the art would appreciate that the head 21 could also be a two-dimensional structure and could be of various geometric configurations other than a trapezoid.

The reflector 26 is formed by application of a polymer material such as PMMA (polymethyl methacrylate) or any other polymer that has a lower optical index than $AL_2O_3$. Optionally, a mirrored surface can be formed on the reflector 26 in place of the polymer to achieve the desired effect by, e.g., sputtering or vapor deposition. The polymer material used to form the reflector 26 can be applied using a pipette or any other auto dispensing equipment known in the art.

Figure 4:
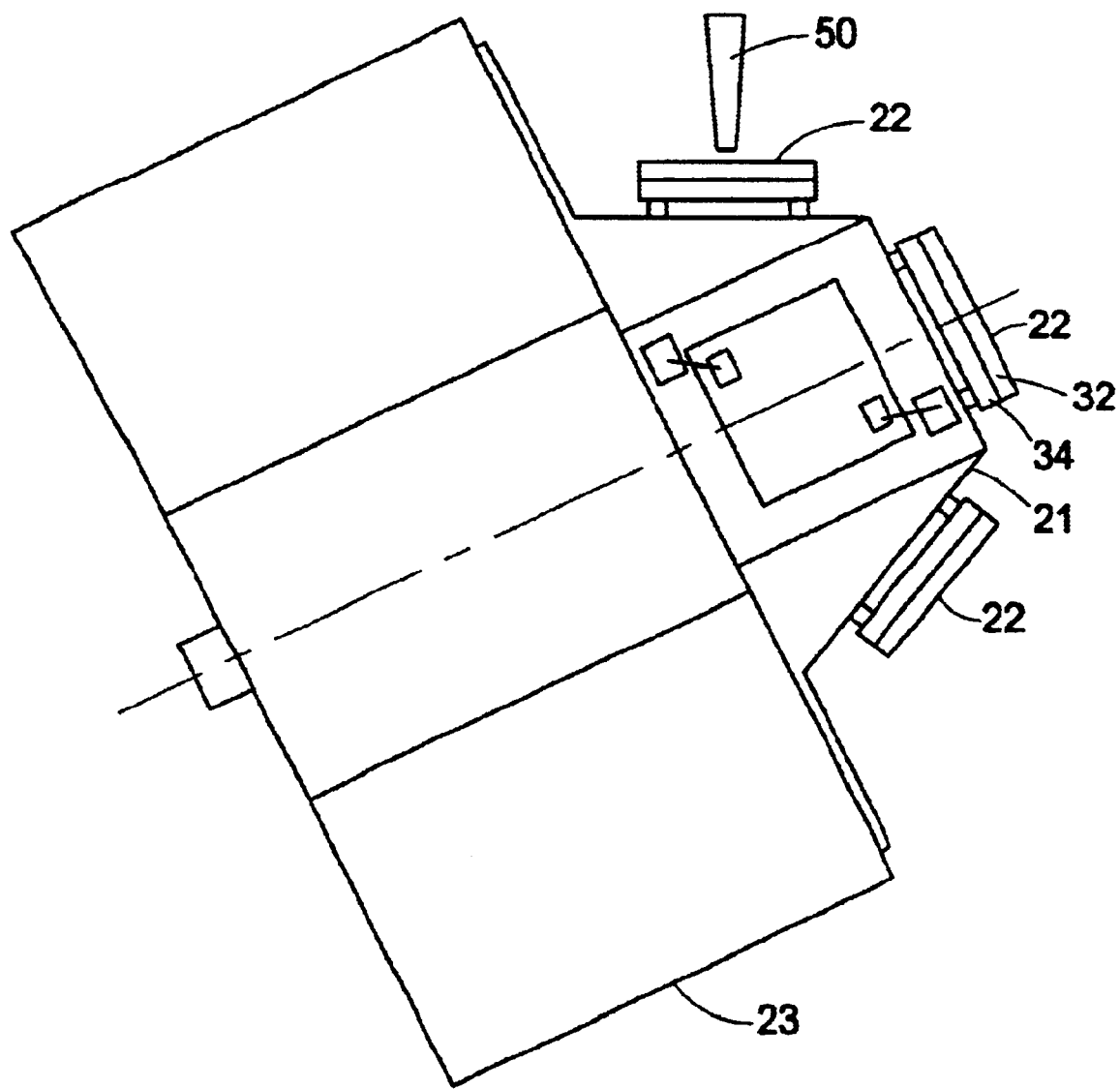
FIG. 4 is a side partial view of an LED assembly process for the multi-angled LED array of FIG. 1.

The LED die 22 may be placed on a flex circuit and process flat and therafter applied to the trapezoidal head 21, or may be applied to the head 21 directly. For example, FIG. 4 is a side partial view of a preferred LED assembly process for the multi-LED lamp 20. The LED die 22 placed flat by a machine (not shown) while a the LED lamp head 21 is angled. The machine (not shown) is preferably a highly-automated pick-and-place machine. A die placement tool 50 is used to position each die 22 on the LED lamp head 21. As illustrated in FIG. 4, the multi-LED lamp 20 is positioned off axis for die assembly. The die 22 are positioned on the sides of the lamp head 21 as illustrated in FIG. 4. The multi-LED lamp 20 is then turned ninety degrees so that the LED die 22 can be placed on the top of lamp head 21. Conventional wire bonding, flip chip (micro BGA) technology such as IBM C4, or a combination thereof, may be used. If C4 technology is used, a thermal underfilling (not shown) may be needed for improved thermal connection of the LED die 22. Thermal underfilling is well-known to those skilled in the art and is typically an epoxy material impregnated with thermally enhancing materials such as powdered diamond (0.25 to 5 micron size range), alumina, or aluminum nitride, in the 0.25 to 5 micron size range.

The transfer molded multi-LED lamp 20 further includes a transfer-molded insert 23 comprised of wire bond areas 28 and thermally conducting, electrically insulating material 29 as best illustrated in FIG. 1. The wire bond areas 28 are placed as metal structures and inserted prior to the molding process. These wire bond areas 28 may be formed after the fact by elaborate metallization processing. In the preferred embodiment, a metal structure is placed in the mold cavity, and the polymer molding compound, i.e., the thermally conducting, electrically insulating material 29 flows around it to anchor it in place. Copper with nickel plating or many other lead frame materials well-known in the art may be used as the wire bonding area 28, including Kovar with nickel plating or gold plating. This molded insert 23 is made of any material that has good thermal properties such as a thermally conducting, electrically insulating material 29 which may be injection or transfer molded. Preferably the material 29 is Plaskon® SMT-B-1, a product of Amoco Electronic Materials (Plaskon Division), which is a highly-filled fast curing epoxide having good thermal and electrical insulation properties. Many other companies, including Dexter Hysol, make similar materials. The material 29 is preferably transfer molded into electrical feed-throughs and connections, thereby enabling the proper height and die attachment profiles to be attained.

The five-faced head structure 21 may be integral to the transfer molded insert 23 of the multi-LED lamp 20 or may be inserted into the structure using a silver epoxy, or any solder of the type well-known to those skilled in the art for final connection to a battery area.

The height of the head 21 may be adjusted slightly for tolerance variations as many flashlight assemblies have a turning of the lens assembly to slightly adjust the light focus point. Further, reflective areas (not shown) of silver or other highly reflective metal such as aluminum may be used to enhance the secondary reflection of the GaN LED die 22. For example, any area where the light hits should be metallized with silver or aluminum. Electrical connections are fed through and molded in the trapezoidal head 21 to allow for application of electrical power.

The placement of the LED die 22 in the lamp head 21 is critical for repeatability from appliance to appliance and thus mandates exact placement of the LED die. In this regard, IBM C4, also known as flip chip bonding and micro BGA bumping, is preferred as compared to wire bond technology, since the placement of the die 22 with the pick-and-place machine is not the determining factor for final positioning of the die 22. The melted solder has a well-known and well-characterized surface tension, which snaps or moves the die 22 to a neutral force position using the surface tension energy. This "snap to grid" feature of the C4 technology, using the surface tension of the solder, provides excellent repeatability.

The GaN technology can also be optimized by directing light out the transparent back of the die 22 (i.e., the sapphire side) by basically optimizing a flip chip format. This allows the entire backside to become the light-emitter, as opposed to the topside, which includes metal-blinded areas his technology is described in detail in copending application Ser. No. 09/542,037 for Flip Chip LED Apparatus filed Apr. 3, 2000. Additionally, the die 22 may be wire-bonded to the lamp head 21 as is well understood by one of ordinary skill in the art.

Moreover, as can be readily appreciated by one skilled in the art, each of the LED die 22 can be energized or deenergized in a predetermined order to effect dimming of the LED lamp 20 as appropriate.

Figure 2:
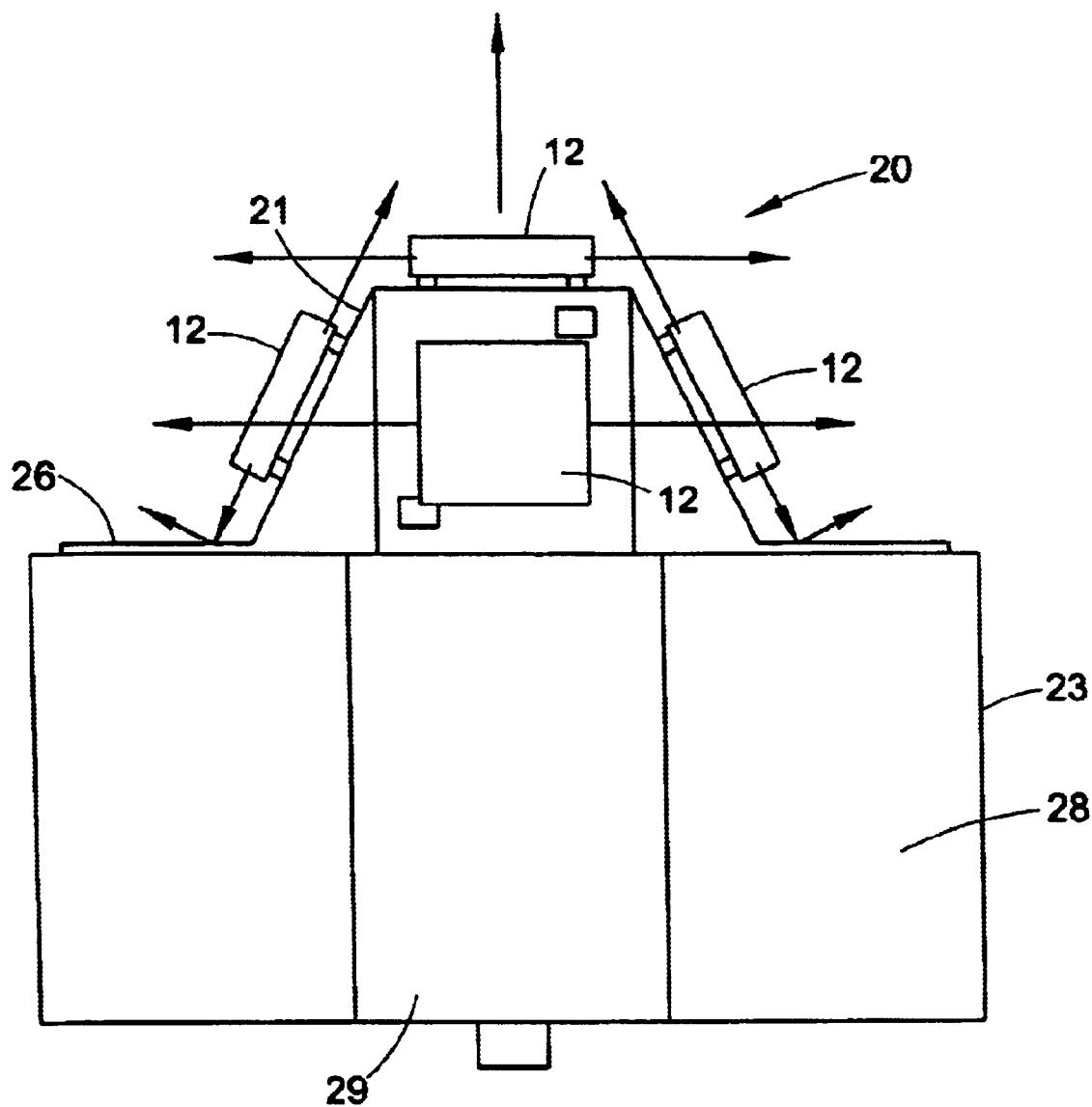
FIG. 2 is the multi-angled LED array of FIG. 1, including the application of a phosphor layer to each LED die.

In FIG. 2, a phosphor layer 12 is applied to the top and sides of each of the LED die 22 in a manner known to those skilled in the art. Phosphor application is used to convert blue, UV, or other light from an LED, to other colors, including white light—a practice which is well-known to those skilled in the art. Variations in phosphor thickness of the phosphor layer translate into variations in light out which in turn affects the LED quality, purity, intensity, color and distribution. As well understood by one skilled in the art, the thickness of the phosphor layer 12 varies with the input light intensity. An excess of phosphor degrades the net light out whereas too thin of a phosphor layer 12 allows UV light to escape. The thickness of the phosphor layer 12 as illustrated in the Figures is not determinative of the actual thickness that would be used in the various embodiments shown. In the embodiment of FIG. 2, light emits out of the tops and sides of die 22 and is transformed to white light by the phosphor layer 12.

Referring to FIGS. 3 through 9, the inventive aspects of the present invention are disclosed. The multi-LED lamp 20 of FIG. 3 and FIG. 5 includes a concave or convex lensing structure 10. The exact lensing structure 10 used for a desired system is determined based on the overall system. The lensing structure 10 shown in FIG. 3 can be in the form of a lens, bulb or housing surrounding the head 21 of the multi-LED lamp 20. The light emitted from the top and sides of the GaN LED die 22 is reflected to a phosphor layer 12 disposed on an underside of lensing structure 10. Light from the multi-LED lamp 20 excites the phosphor layer 12 on the lensing structure 10. These phosphors are chosen to excite in the areas of emission of the LED, such as 460–480 nanometers, and 370–420 nanometers. The phosphor is preferably fluorescent material (YAG phosphor) activated with cerium and many variants thereof. A preferred phosphor is disclosed in U.S. Ser. No. 09/203,212, filed Nov. 30, 1998. As disclosed in that application, a preferred phosphor is a green-emitting phosphor having the general formula $LnBO_3$: $Ce^{3+}$, $Tb^{3+}$, which can be expressed stoichiometrically by the formula $Ln_xBO_3$: $Ce^{3+}_y$, $Tb^{3+}_z$, where:

Ln includes one ore more of Sc, Y, La, Gd, Lu $x=1-(y+z)$ $0 \leq x \leq 0.98$ $0.01 \leq y \leq 0.5$ $0.01 \leq z \leq 0.5$ Preferred Ln elements are Y, Gd, Sc, and La. The green-emitting phosphor can be an yttrium-based phosphor, $Y_xBO_3$: $Ce^{3+}_y$, $Tb^{3+}_z$, in which the other Ln elements are absent, a mixture of yttrium and one or more of gadolinium, lanthanum, scandium, and lutetium, or an yttrium-free composition containing one or more of the remaining Ln elements. In one preferred embodiment, the green-emitting phosphor comprises 50 parts Y, 50 parts Gd, 20 parts Ce and 10 parts Tb (i.e. approximately $(Y_{0.39}Gd_{0.39})BO_3$: $Ce^{3+}_{0.15}$, $Tb^{3+}_{0.07}$). In general, it is preferable for the ratio of CE:Tb to be about 2:1 and for n to be at least about 0.2. Other lanthanum elements may also be used as Ln elements in the green phosphor, particularly those that contribute to the green-emitting properties of the phosphor. While small amounts of other, non-lanthanide-type elements (i.e., other than Y, Sc, and lanthanide series elements) may be present in the green-emitting phosphor, these are preferably kept at low levels to maintain the efficiency of the phosphor.

In the description of these phosphors, a conventional notation is used, wherein the chemical formula for a host or matrix compound is given first, followed by a colon and the formula for an activator (an impurity that activates the host crystal to luminesce). For example, in the case of a green emitter, $(Y_aGd_bLa_cSc_d)BO3$:$Ce^{3+}$, $Tb^{3+}$, $(Y_aGd_bLa_cSc_d)BO_3$ is the host and $Ce^{3+}$ and $Tb^{3+}$ are the activators.

The green-emitting phosphor converts radiation in the blue/UV portion of the spectrum to green light and thus has application in the conversion of radiation from UV/blue laser and light emitting diodes. One skilled in the art, however, would appreciate that numerous phosphors are suitable for practice in the present invention to absorb the light emitted by the light emitting component and emit light of a wavelength different than the absorbed light.

Figure 5:
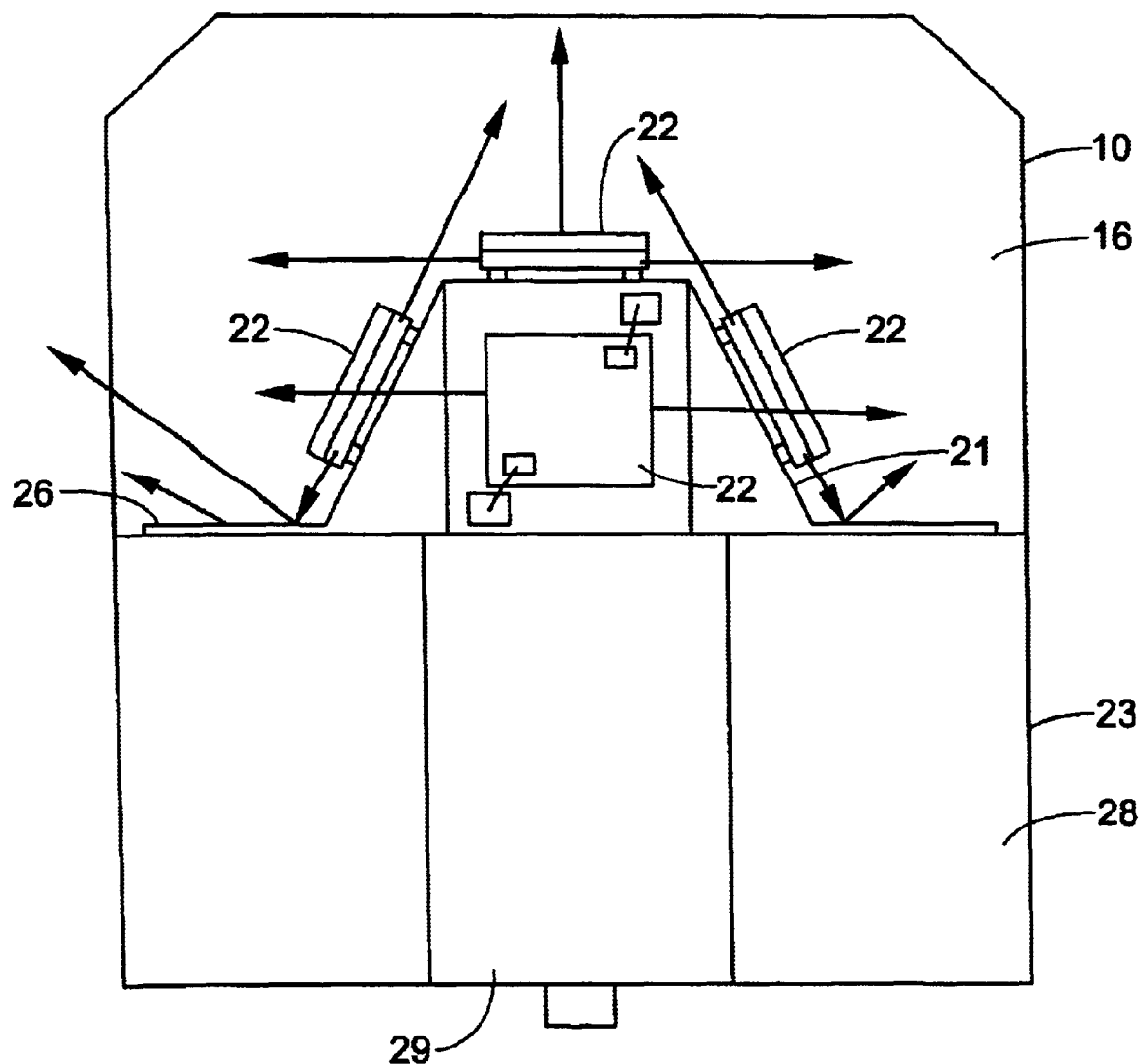
FIG. 5 is a side partial view of a multi-angled LED array for use in a newly-designed or a retrofit structure for a commercial flashlight.

The lensing structure 10 is concave in the embodiment of FIG. 3 and convex in the embodiment of FIG. 5. The lensing structure 10 may be formed of any lensing material selected from a great number of polymers having a lower index of refraction than the substrate 32 of the LED die 22 and the semiconductor layer 34 of the LED die 22. Suitable lensing materials are set out below in TABLE I.

TABLE I

| Polymer | Index of Refraction |
|---|---|
| TEFLON ® AF-1600 (DuPont) | 1.29–1.31 |
| TEFLON PFA (DuPont) | 1.34 |
| PMMA | 1.49–1.56 |
| Epoxies | 1.5–1.6 |
| Polycarbonate (GE) | 1.573 |
| Parylene (Novatran Corp.) | 1.639 |
| Parylene N | 1.661 |
| Parylene D | 1.669 |
| Polyetherimide (GE) | 1.641 |
| Polyimides: | |
| KAPTON (DuPont) | 1.66 |
| SPI-129 (MicroSi) | 1.732 |
| PI-2555 (DuPont) | 1.702 |
| SIXEF-44 (Hoescht) | 1.627 |
| XU-218 (Ciba-Geigy) | 1.614 |
| PI (Honeywell) | 1.62–1.65 |

TABLE I-continued

| Polymer | Index of Refraction |
| --- | --- |
| PROBIMIDE ® 400 (Ciba-Geigy) | 1.64 |
| Silicone: | |
| Silicone (RTV) | 1.4–1.5 |

Further, the lensing structure 10 could be formed from any glass material, preferably quartz.

The surface tension characteristics of the polymer lensing material are used to form the concave or convex structure, depending upon the amount of material applied. Application of a greater amount of material creates a domed structure, thus forms a converging lens, and forming a polymer as shown in FIG. 3 creates a diverging lens. Thus concave and convex lens structures may be formed, each having well-known characteristics.

The polymer lensing material can be applied by any automated or manual methods well-known to those skilled in the art. A cycloaliphatic epoxy such as CY179, made by Ciba Geigy Chemicals, is the preferred polymer lensing material. The CY179 material is catalyzed by a GE material from GE Silicones of Waterford, N.Y. sold under the trademark Octacat® is used for proper curing conditions. A co-catalyst of copper napthanate, at 3–10 ppm, is used in connection with epoxy solids. The epoxy has a natural surface tension wall at the sharp edges of the die, and naturally forms dome-like structures. The viscosity of the epoxy may be lowered by incorporation of solvents such as anisole, monomers such as BGE (butyl glycidal ether), and plasticizers such as styrene.

Figure 6:
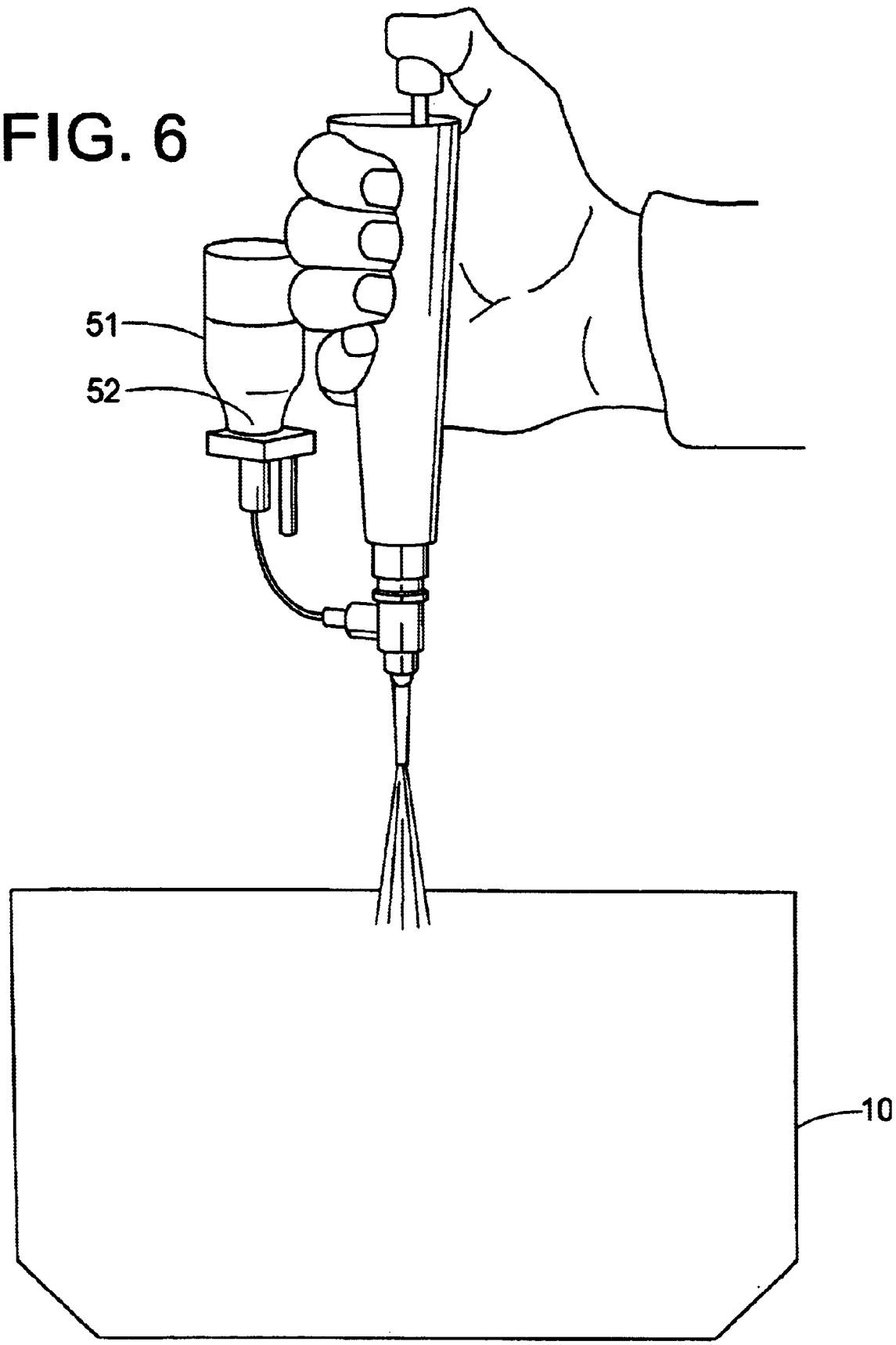
FIG. 6 is a schematic diagram illustrating application of a phosphor layer to the lensing structure of the present invention.

FIG. 6 illustrates one process for application of the phosphor layer 12 to the bulb or lensing structure 10, which is well known in the art of phosphor layer of fluorescent bulbs. This process uses an adhesion coating and a firing process at ~600 C to adhere the phosphors to the glass material, and burn off the organic binders used to hold the phosphors in suspension. A bottle 51 contains a phosphor blend 52 comprising the preferred phosphor materials and an adhesion promoter in amounts dependent on the desired application. The phosphor blend 52 is used to coat the lensing structure 10 with the phosphor layer 12. A suitable example of the adhesion promoter includes an alumina powder.

Where a polymer bulb is used as the lensing structure 10, an organic binder is used as the adhesion coating to adhere the phosphor blend 52 to the polymer bulb or lensing structure 10. Epoxies and other polymers that are resistant to degradation by the UV from the LED are suitable for this application, including the cycloaliphatic epoxy CY179, by Ciba Giegy Chemicals. Polymer blend 52 is dipped, sprayed, or otherwise applied to the inside or outside of the bulb lensing structure 10 and dried and cured. Where solvents are present, the solvents must be evaporated off prior to the curing of the epoxy.

Multiple coats of the phosphor blend 52 may be accomplished with the foregoing technique. Adhesion promoters such as epoxy silane materials, which are well-known in the art of epoxy to ceramic adhesion, are used in the event a greater water-resistant bond is desired. These materials may be applied directly to the polymer bulb lensing structure 10, or may be incorporated into the polymer phosphor blend 52.

An alternate to this application process is one wherein the temperature of the polymer forming the lensing structure 10 is raised to its softening point so that it becomes sticky. This process may be done in situ with the initial molding of the bulb lensing structure 10. The phosphor 52 blend is blown in by a heated gas jet to disperse the phosphor to the inside of the bulb and effect coating of the inside of the bulb lensing structure 10. The hot gas maintains the softness of the polymer surface to allow the process to be effective. This process provides for instantaneous coating of the bulb lensing structure 10 and does not require a curing or drying cycle.

A further alternate process for the coating of the inside of the polymer bulb or lensing structure 10 is accomplished using a solvent to partially dissolve the outer surface or inner surface of the lensing structure 10 so that it softens and becomes sticky. The solvent is applied by spraying, dotting, stamping or other suitable technique. Suitable examples of the solvent include hydrocarbon based materials such as acetone, alcohols, tetrahydrofuran, acetophenone, xylenes, anisole, and the like, and blends of the same. The phosphor blend 52 as noted earlier, is blown in by a heated gas jet designed to randomly disperse the ceramic phosphor blend 52 followed by a step to free the lensing structure 10 from any solvent remaining residue.

In the embodiment of FIG. 7, the phosphor layer 12 is applied to the inner and outer surface of the lensing structure 10 formed on an LED die 40 in a flip chip arrangement. As shown in FIG. 7, the polymer lensing material is formed on the bottom surface of the LED substrate 32 to diverge the light. A laser ablation process, well-known to those skilled in the art, is preferably used. The laser ablation process forms the necessary optical curvature to obtain proper focus parameters. The preferred flip chip LED 40 die is disclosed in detail in copending application Ser. No. 09/542,037 for Flip Chip LED Apparatus filed Apr. 3, 2000. The phosphor layer 12 is applied to both the inner and outer surface of the lensing structure 10, preferably using one of the above-illustrated processes. Alternatively, one skilled in the art would appreciate that the phosphor layer 12 could be applied solely to the outer surface or inner surface of the lensing structure 10.

In the flip chip microball grid array (micro BGA) structure 40, the semiconductor layer 34 is grown on the top surface (wafer deposition side) of the transparent substrate 32. Micro ball grid array (micro BGA) bonding pads 42 are attached to semiconductor layer 34 on a contact surface of layer 34. The micro BGA bonding pad 42 typically comprises one or more layers of metals such as gold, nickel, aluminum, platinum, chromium, indium, and/or tin, for example. In the preferred embodiment, the bonding pad 42 comprises titanium/ tungsten/nickel/gold (Ti/W/Ni/Au) with the Ti/W ranging from 500 to 5000 angstroms, the Ni ranging from 5000 to 20000 angstroms, and the gold ranging from 300 to 1500 angstroms.

The flip chip solder bump 46 of the bonding pad 42 is of the kind well-known to those skilled in the art.

FIGS. 8 and 9 illustrate the flip chip die 40 of FIG. 7 disposed onto contact pads 44 and soldered or epoxied in place on a flat interconnect board 48.

As shown in FIG. 7–9, the sharp edges of the LED die and surface tension of the polymer lensing material 16 inherently form a dome-like structure or lensing structure 10 on the bottom of the die surface of the flip chip embodiment 40. The polymer lensing material 16 may be applied by metered pipettes, for example, and subsequently dried or cured in place by air or vacuum drying, ultra violet light cross-linking or by heat curing. In the preferred embodiment, the polymer lensing material 16 layer is applied to substrate 32 and UV light in the 360 nanometer range is used to cure. Drying of the polymer lensing material 16 may be aided by a warm air cross flow oven, or vacuum oven. The light in the embodiment is emitted in all directions from the LED die structure and is redirected by the polymer lensing material 16 comprising the lensing structure 10 to form a directed and convergent light focus.

The invention has been described with reference to the preferred embodiment. Obviously, modifications and alterations will occur to others upon the reading and understanding of the specification. For example, the inventive lensing structure of the present invention could be applicable to many light-emitting semiconductor devices other than a light-emitting diode, including laser diodes and wide brand gap light-emitting diodes. The invention is intended to include all such modifications and alterations insofar as they come within the scope of the appended claims or the equivalents thereof.

What is claimed is:

1. An LED lamp structure which comprises:
   a plurality of LED die;
   a three-dimensional reflective head having a surface that supports the LED dice arranged in a non-planar three-dimensional array on the reflective head; and
   at least one lensing structure arranged over the reflective head, at least one surface of the at least one lensing structure having a phosphor layer applied thereto, the lensing structure positioned over the reflective head so that emitted light from the LED dice excite the phosphor layer.

2. The LED lamp structure of claim 1 wherein the at least one lensing structure is a bulb.

3. The LED lamp structure of claim 1 wherein the at least one lensing structure is a lens.

4. The LED lamp structure of claim 3 wherein the lens is convex.

5. The LED lamp structure of claim 3 wherein the lens is concave.

6. The LED lamp structure of claim 1 wherein the at least one lensing structure is a housing enclosing the reflective head.

7. The LED lamp structure of claim 1 wherein the at least one lensing structure is comprised of a polymer lensing material or a glass.

8. The LED lamp structure of claim 7 wherein the polymer lensing material is selected from a group consisting of an epoxy, PMMA, a polycarbonate, a polyimide or mixtures thereof.

9. The LED lamp structure of claim 1 wherein the phosphor layer is applied to the outer surface of the at least one lensing structure.

10. The LED lamp structure of claim 1 wherein the phosphor layer is applied to the inner surface of the at least one lensing structure.

11. An LED lamp structure which comprises:
    a plurality of LED die;
    a reflective head supporting the LED dice; and
    at least one lensing structure arranged over the reflective head, at least the at least one lensing structure having a phosphor layer applied to the inner surface and the outer surface of the at least one lensing structure, the lensing structure positioned over the reflective head so that emitted light from the LED dice excite the phosphor layer.

12. The LED lamp structure of claim 1 wherein the LED dice produce light predominantly at ultraviolet wavelengths which is converted by the phosphor layer into visible light.

13. The LED lamp structure of claim 1 wherein the LED dice are flip chip bonded to the reflective head.

14. An LED lamp structure which comprises:
    a plurality of LED die;
    a multi-faceted reflective head, the LED dice being supported on reflective facets of the reflective head; and
    at least one lensing structure arranged over the reflective head, at least one surface of the at least one lensing structure having a phosphor layer applied thereto, the lensing structure positioned over the reflective head so that emitted light from the LED dice excite the phosphor layer.

15. The LED lamp structure of claim 1 wherein the at least one lensing structure includes:
    a substantially hollow housing that surrounds the reflective head but does not contact the LED dice.

16. The LED lamp structure of claim 15 wherein:
    the phosphor layer is disposed on an inside surface of the hollow housing.

17. The LED lamp structure of claim 15 wherein the LED dice are bare LED dice without encapsulating housings.

18. A method for producing lamp illumination, the method including:
    supporting a plurality of LED dice on a reflective head;
    applying a phosphor layer to an inner surface of a hollow housing to produce a phosphorized lensing structure, the phosphor layer being applied by blowing a phosphor material into the hollow housing by a heated gas jet, the heated gas jet heating the hollow housing such that the inner surface becomes sticky and the phosphor material adheres thereto to define the phosphor layer;
    arranging the phosphorized lensing structure over the reflective head; and
    energizing the LED dice to emit light that irradiates the phosphor layer, the phosphor layer producing the lamp illumination responsive to the irradiation.

19. The method as set forth in claim 18, further including:
    softening the lensing structure prior to applying the phosphor layer.

20. The method as set forth in claim 18, wherein the lensing structure is a hollow housing that subsequent to the arranging surrounds the reflective head but does not contact the LED dice, the applying of the phosphor layer including:
    applying the phosphor layer to an inner surface of the hollow housing by adhesion coating; and
    annealing the hollow housing including the applied phosphor layer.

21. The method as set forth in claim 18, wherein the lensing structure is a hollow housing that subsequent to the arranging surrounds the reflective head but does not contact the LED dice.

22. The method as set forth in claim 18, wherein the applying of the phosphor layer further includes:
    prior to the blowing, applying a solvent to the inner face of the hollow housing to soften the inner surface and mote phosphor adhesion.

* * * * *